US008721359B1

(12) United States Patent
Tate

(10) Patent No.: US 8,721,359 B1

(45) Date of Patent: May 13, 2014

(54) HEAT SINK SOCKET

(71) Applicant: John O. Tate, Lincoln, RI (US)

(72) Inventor: John O. Tate, Lincoln, RI (US)

(*) Notice: Subject to any disclaimer, the term of this patent is extended or adjusted under 35 U.S.C. 154(b) by 0 days.

(21) Appl. No.: 14/057,871

(22) Filed: Oct. 18, 2013

Related U.S. Application Data

(60) Provisional application No. 61/716,047, filed on Oct. 19, 2012.

(51) Int. Cl.
*H01R 13/00* (2006.01)
*H05K 7/20* (2006.01)

(52) U.S. Cl.
CPC ........ *H05K 7/20436* (2013.01); *H05K 7/20418* (2013.01)
USPC .......... 439/487

(58) Field of Classification Search
CPC .......... H05K 7/20418; H05K 7/20436
USPC .......... 439/485, 487
See application file for complete search history.

(56) References Cited

U.S. PATENT DOCUMENTS

| | | | | | |
|---|---|---|---|---|---|
| 2,973,400 | A * | 2/1961 | McAdam | 174/395 |
| 3,280,907 | A * | 10/1966 | Hoffman | 165/185 |
| 3,518,493 | A * | 6/1970 | George et al. | 361/707 |
| 3,605,075 | A * | 9/1971 | Stofkooper | 439/525 |
| 3,917,375 | A * | 11/1975 | Johnson | 439/487 |
| 4,494,814 | A * | 1/1985 | Oyama | 439/485 |
| 5,909,056 | A | 6/1999 | Mertol | |
| 6,373,131 | B1 | 4/2002 | Karnezos | |
| 6,630,371 | B2 | 10/2003 | Hembree | |
| 6,736,668 | B1 * | 5/2004 | Kholodenko et al. | 439/487 |
| 7,128,604 | B2 * | 10/2006 | Hall | 439/578 |
| 7,230,830 | B2 | 6/2007 | Ujike et al. | |
| 7,946,881 | B2 | 5/2011 | Hsieh et al. | |
| 7,988,459 | B2 * | 8/2011 | Ulen et al. | 439/73 |
| 8,062,933 | B2 | 11/2011 | Huang et al. | |
| 8,422,233 | B2 * | 4/2013 | Li et al. | 361/720 |
| 2012/0104591 | A1 | 5/2012 | Warren et al. | |
| 2013/0118008 | A1 | 5/2013 | Gaynes et al. | |
| 2013/0119535 | A1 | 5/2013 | Joshi | |
| 2013/0122656 | A1 | 5/2013 | Tomita et al. | |
| 2013/0208428 | A1 * | 8/2013 | Hui et al. | 361/720 |

OTHER PUBLICATIONS

Robinson, S., "Thermal issues count in high-power amp design", IEE Power Electronics Technlogy, 2005, pp. 44-50. Abstract only.

* cited by examiner

*Primary Examiner* — James Harvey
(74) *Attorney, Agent, or Firm* — Barlow, Josephs & Holmes, Ltd.

(57) ABSTRACT

A heat sink socket for cooling electronic devices has a heat conducting body having an upper surface for receiving an electrical component and a lower surface for engaging a supporting circuit board. An insulated terminal has an electrical insulating body supporting a first electrical terminal within the heat conducting body. The first electrical terminal connects an electrical contact of the electrical component to the circuit board. The heat sink socket may include a ground plane on the heat conducting body. The ground plane may have a second electrical terminal that connects an electrical contact of the electrical component to the circuit board.

20 Claims, 15 Drawing Sheets

HEAT SINK SOCKET

CROSS REFERENCE TO RELATED APPLICATIONS

This application is related to and claims priority to earlier filed U.S. provisional patent application 61/716,047, filed Oct. 19, 2012, the entire contents of which are incorporated herein by reference.

BACKGROUND AND SUMMARY OF THE INVENTION

The instant invention relates to cooling of electronic devices.

A heat sink is a passive component that draws heat from a device and dissipates the heat into the surrounding atmosphere. High power lasers, optoelectronic devices, semiconductor devices and light emitting diodes (LED) are all examples of electronic devices that require some form of cooling.

The basic principle of heat transfer is to transfer thermal energy from a higher temperature device to a lower temperature environment. This is done by conduction and other means. To minimize overheating of a device, an efficient heat transfer path must be routed from the component to the heat sink to the printed circuit board (PCB) and the environment. Typically a heat sink component is placed into physical contact with the electronic device to draw heat by conduction from the outer surface of the device to the heat sink. To improve the thermal performance of heat sinks, a thermal adhesive is applied to the heat sink to fill any air gap between the facing surfaces heat sink and device.

Heat is carried away from the heat sink by convection and air flow moving over or under the surface of the heat sink. The greater the surface area of the heat sink over which air can flow, the greater the results.

The instant invention provides a heat sink socket having a heat conducting body that helps cool electronic devices and provides insulated electrical terminals for the electronic devices.

The invention addresses the increasing need for cooling electronic devices that cannot be cooled with conventional heat sinks mounted on top of the electronic devices. Electronic devices (such as image sensors, optoelectronics, some power devices, pin grid arrays, ball grid arrays, and dual inline sockets) that have an opening at their top cannot have a heat sink mounted on the top of the device. This invention has addressed the problem of removing heat in open top devices or any heat providing device with or without a top opening, to prevent failures.

The heat sink socket has a heat conducting body that dissipates heat from an electronic component. The heat sink socket is configured so that it may be mounted on or above a printed circuit board. To allow electronic components to be connected to the printed circuit board, the heat sink socket has electrical terminals that pass through the heat sink socket.

The heat conducting body has an upper surface on which an electrical component may rest. The upper surface may be substantially flat or otherwise configured to support the electrical component. The lower surface of the heat conducting body is configured to engage a circuit board or another supporting surface. The lower surface may directly contact the circuit board, or it may be supported so that there is a gap between the circuit board and the heat conducting body, as discussed below.

The heat conducting body is configured so that the electrical component may be in electrical communication with the printed circuit board. For this purpose, there is at least one insulated terminal formed in the heat conducting body. The insulated terminal has an electrical insulating body inserted into a first aperture in the heat conducting body, and extending through the heat conducting body from the upper surface to the lower surface. The outer wall of the insulating terminal frictionally engages the inner wall of the first aperture.

A first electrical terminal, or insulated electrical terminal, is supported within the insulating aperture of the electrical insulating body. The first electrical terminal has an outer wall that engages the inner insulating aperture wall to frictionally secure the first electrical terminal within the insulating aperture. The first electrical terminal, or insulated electrical terminal, enables an electrical component above the heat conducting body to electrically communicate with a circuit board below the heat conducting body. For this purpose, the electrical terminal has an upper terminal end and a lower terminal end. A socket is located at the upper terminal end, and does not extend above the upper surface of the heat conducting body. The socket is configured to receive an electrical contact of an electrical component. An electrical connector is located at the lower terminal end, which extends beyond the lower surface of the heat conducting body for electrical engagement with the circuit board.

To allow the heat sink socket to provide power to more than one component, the heat sink socket may include more than one of the insulated electrical terminals. Additionally, in some embodiments, there may be more than one insulated electrical terminal inserted into a single electrical insulating body.

In some embodiments, the heat sink socket includes a ground plane, which includes a second terminal, or grounded terminal. This grounded terminal is in direct electrical communication with a ground plane on the heat sink body, so that electrical components may connect to the ground plane.

The second electrical terminal is inserted into a second aperture in the heat conducting body. The second aperture extends through the heat conducting body from the upper surface to the lower surface.

The second electrical terminal has an outer wall that frictionally and electrically engages the inner wall of the second aperture to secure the second electrical terminal within the second aperture and to provide an electrical connection to the ground plane. The second electrical terminal has an upper terminal end and a lower terminal end. A socket is located at the upper terminal end, and does not extend above the upper surface of the heat conducting body. The socket is configured to receive a ground contact of an electrical component. An electrical connector is located at the lower terminal end, and extends beyond the lower surface of the heat conducting body for electrically engaging the circuit board.

The heat sink may be provided with multiple insulated terminals. Where there are a multiple terminals, they may be organized in an array. For example, the terminals may be arranged in a planar array that is in the shape of a square, a rectangle, a line, a circle, or another geometric shape.

To improve the heat dissipating performance of the heat sink, the heat sink may be configured with one or more heat dissipating fins formed on a peripheral edge of the heat conducting body.

When mounted on a circuit board, the heat sink socket may be in direct contact with the circuit board. It may contact a conductive material such as copper. This conductive material can be connected to the ground plane, and it may conduct heat away from the heat sink socket.

In another configuration, the heat sink socket may be mounted so that there is a gap between the heat sink socket and the circuit board. In this configuration, heat is transferred from the heat sink socket by convective currents at the lower surface and sides of the heat sink socket.

Accordingly, among the objects of the instant invention are: the provision of a heat sink socket for cooling electronic devices that cannot be cooled with conventional heat sinks mounted on top of the electronic devices. Another object of the instant invention is the provision of a heat sink having a ground plane which can be electrically connected to an electrical contact on an electrical component.

Other objects, features and advantages of the invention shall become apparent as the description thereof proceeds when considered in connection with the accompanying illustrative drawings.

DESCRIPTION OF THE DRAWINGS

In the drawings which illustrate the best mode presently contemplated of carrying out the present invention.

DESCRIPTION OF THE PREFERRED EMBODIMENT

Figure 1:
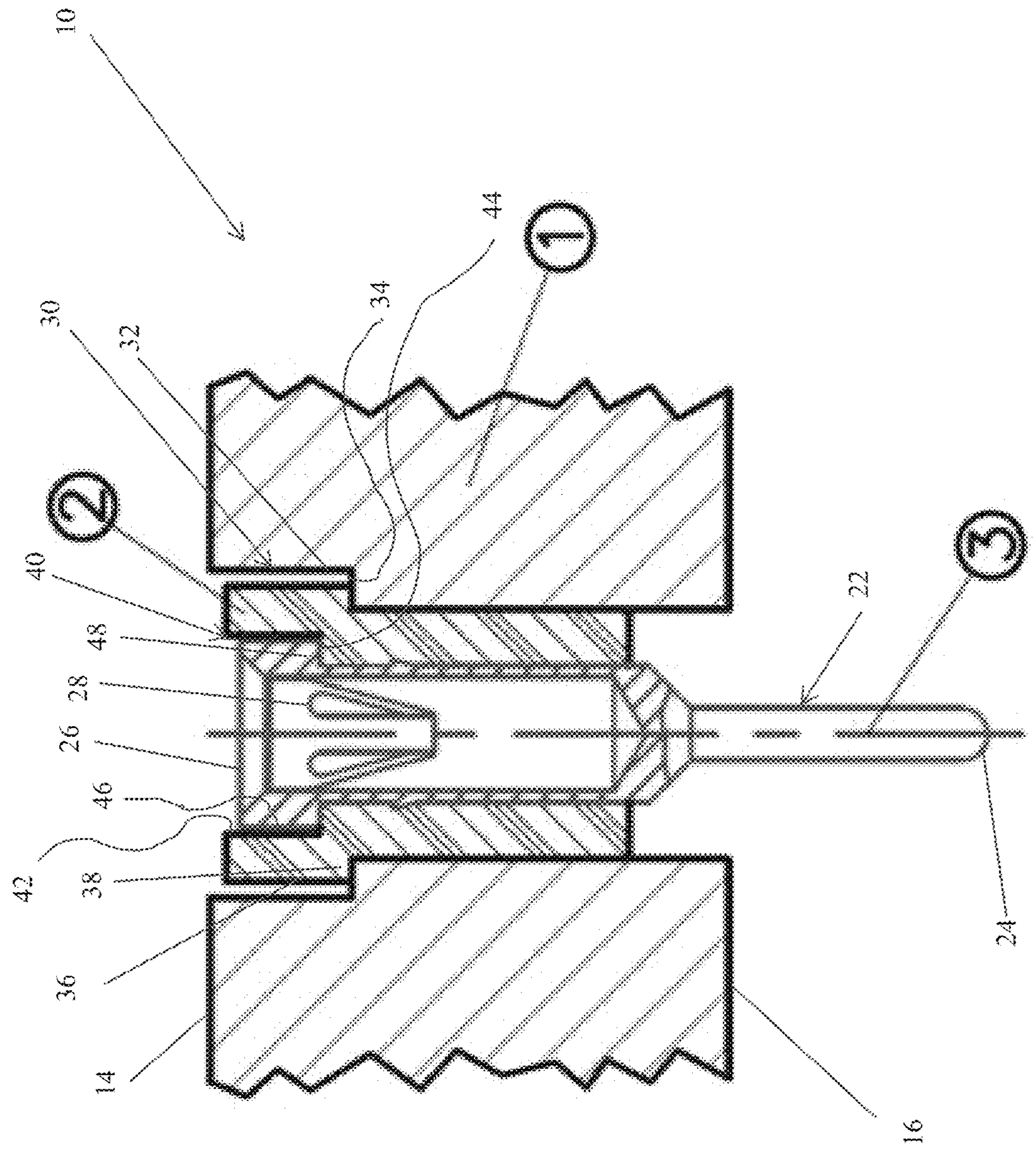
FIG. 1 is a cross sectional view of a first embodiment of the heat sink socket of the present invention.

Referring now to the drawings, the heat sink socket of the instant invention is illustrated and generally indicated at 10 in FIGS. 1-13. As will hereinafter be more fully described, the instant heat sink socket provides a heat sink that dissipates heat from an electronic component.

The heat sink socket of the present invention may have one or more insulated terminals for providing an electrical connection between an electrical component and a circuit board. It may also include one or more non-insulated terminals for connecting electrical components to a ground plane on the heat sink socket.

FIG. 1 shows a cross section of one embodiment of the heat sink socket 10 of the present invention. The heat sink socket 10 has a heat conducting body 1 having an upper surface 14 for supporting an electrical component, and a lower surface 16 that is configured to engage a supporting circuit board. Thus, as explained in more detail below, the electrical device can be supported on the heat conducting body, and the heat conducting body is supported on or above the copper layer of the circuit board, with a first electrical terminal 3 that is insulated from the heat conducting body 1 and extends through the heat conducting body 1 for connecting the electrical component to the circuit board.

Figure 2:
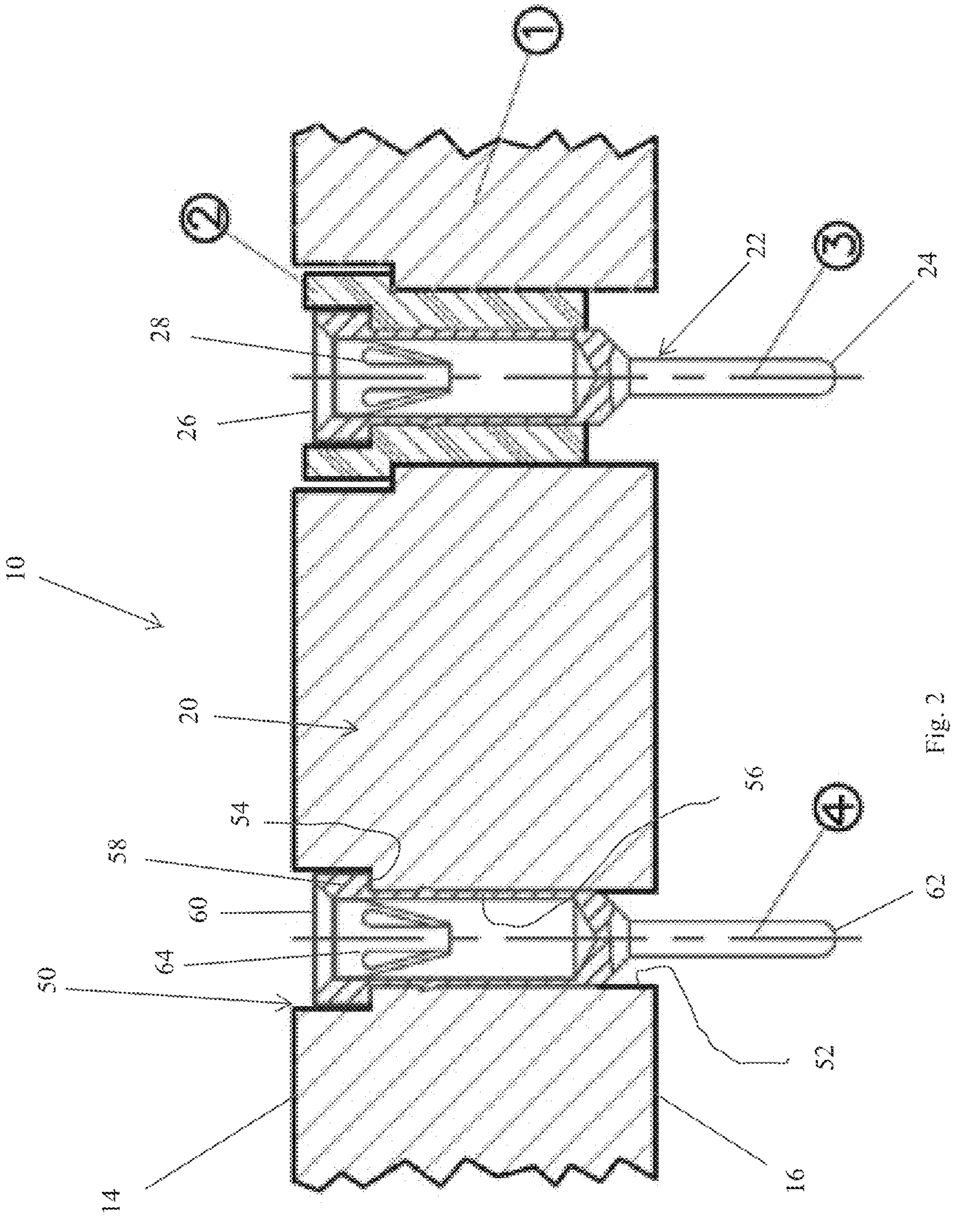
FIG. 2 is a cross sectional view of a third embodiment of the heat sink socket of the present invention.

FIG. 2 shows a cross section of a second embodiment of the heat sink socket, in which the heat sink socket has a first electrical terminal 3 and a second electrical terminal 4. The second electrical terminal, or grounded terminal, 4 is electrically coupled to a ground plane 20 on the heat conducting body 1.

In both embodiments of FIGS. 1 and 2, an insulated terminal 22 has an electrical insulating body 2 that separates a first electrical terminal 3 from the heat conducting body 1. The first electrical terminal 3 has a lower terminal end 24 that extends beyond the lower surface 16 of the heat conducting body. The lower terminal end 24 is in the form of a pin or another electrical connector, such as surface mount (SMD), for engaging a circuit board. The first electrical terminal has an upper terminal end 26 that has a socket 28. The socket 28 is configured to receive a contact, such as a pin connector, of an electrical component. Because the socket 28 and the upper terminal end 26 do not extend above the upper surface 14 of the heat conducting body 1, the electrical connector for the component can be received in the socket and a lower surface of the electrical component can be in direct facing engagement with the upper surface 14 of the heat conducting body 1, to improve heat transfer between the electrical component 11 and the heat conducting body 1.

The structure of the heat conducting body 1 and the electrical insulating body 2 ensure that they are firmly engaged when the electrical insulating body 2 is inserted into a first aperture 30 in the heat conducting body 1. The first aperture 30 and the electrical insulating body 2 are configured in a complementary manner so that the electrical insulating body 2 fits snugly within the first aperture 30. The first aperture 30 forms a continuous channel extending from the upper surface 14 of the heat conducting body to the lower surface 16 of the heat conducting body. The first aperture 30 has an inner aperture wall 32 and a countersunk surface 34 adjacent the upper surface 14 of the heat conducting body. The electrical insulating body 2 has an outer wall 36 that frictionally engages the inner aperture wall 32 of the first aperture so that the electrical insulating body is secured within the first aperture. The electrical insulating body has a stepped shoulder 38 that is seated on the countersunk surface of the first aperture. The stepped shoulder 38 of the insulating body 2 and the countersunk surface 34 of the first aperture facilitate assembly of the heat sink socket. The insulating body is simply pushed, installed, or molded into the first aperture until the stepped shoulder engages the countersunk surface.

Similarly, the electrical insulating body 2 has an insulating aperture 40 having an inner insulating aperture wall 42 and an insulating countersunk surface 44. Some embodiments may not include the countersunk surface. A first electrical terminal is inserted into the insulating aperture 40 of the electrical insulating body. The first electrical terminal 3 has an outer wall 46 that engages the inner insulating aperture wall 42 to frictionally secure the first electrical terminal within the insulating aperture 40. The first electrical terminal has a stepped shoulder 48 seated on the insulating countersunk surface 44 when the heat sink socket is fully assembled.

Figure 1A:
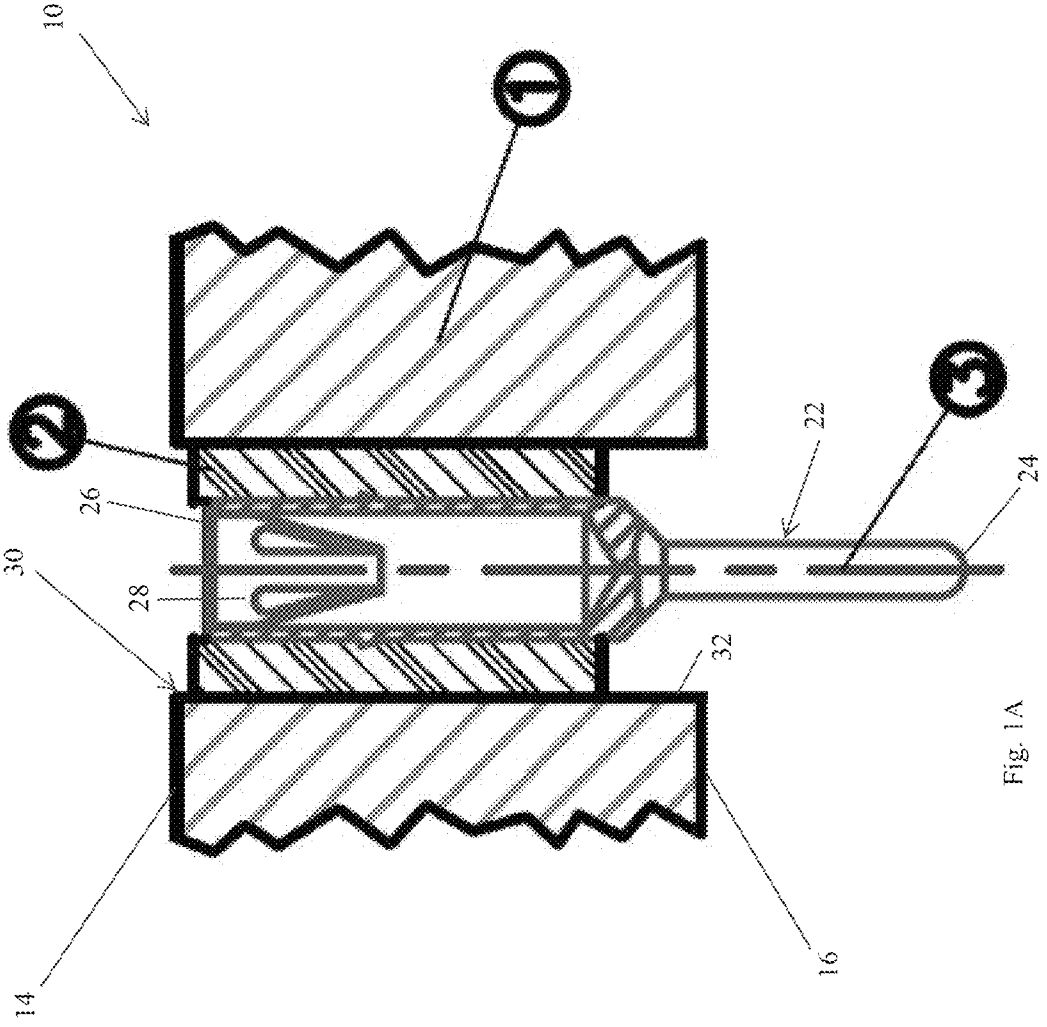
FIG. 1A is a cross sectional view of a second embodiment of the heat sink socket of the present invention without stepped shoulder and countersink structures.

Some embodiments may not include the countersunk surface. FIG. 1A shows an embodiment that does not include the countersunk surfaces on the first aperture 30 and the electric insulating body 2.

In some embodiments, the heat sink socket includes a ground plane 20, which can serve as an electrical ground for electrical components. The ground plane includes a second electrical terminal directly engaging a second electrical aperture on the heat conducting body.

As shown in FIG. 2, the structure of the second electrical terminal 4 and the second electrical aperture 50 are configured to provide a sturdy connection between the two. The second electrical aperture 50 extends through the heat conducting body 1 from the upper surface 14 to the lower surface 16. The second electrical aperture 50 has an inner aperture wall 52 and a countersunk surface 54 adjacent to the upper surface of the heat conducting body, as shown in FIG. 2.

The second electrical terminal 4 directly contacts the second electrical aperture 50 so an electrical signal can be conducted from one to the other. The second electrical terminal 4 has an outer wall 56 that frictionally engages the inner wall 52 of the second aperture to secure the second electrical terminal within the second aperture. The second electrical terminal has a stepped shoulder 58 seated on the countersunk surface 54 of the second aperture.

The second electrical terminal has an upper terminal end 60 for engaging an electrical component, and a lower terminal end 62 for engaging a circuit board. The lower terminal end 62 is in the form of a pin or other electrical connector, and extends beyond the lower surface 16 of the heat conducting body so it can electrically engage a circuit board. The upper terminal end 60 has a socket 64, and does not extend above the upper surface 14 of the heat conducting body 1. The socket 64 can receive a ground contact of an electrical component, and a surface of the component can be in direct contact with the upper surface 14 of the heat conducting body 1.

Similarly to the first electrical terminal shown in FIG. 1A, the second electrical terminal may be configured without a countersunk surface on the aperture 50.

The heat sink socket may employ additional conductive or convective cooling features. FIGS. 3A-3D show how an electrical component 11, the heat sink socket 1, and a circuit board 13 may be arranged. In each configuration, the electrical component 11 has an electrical contact 68 received in the socket 28, and the lower terminal end 24 of the first electrical terminal is received in an electrical socket 70 on the circuit board.

Figure 3A:
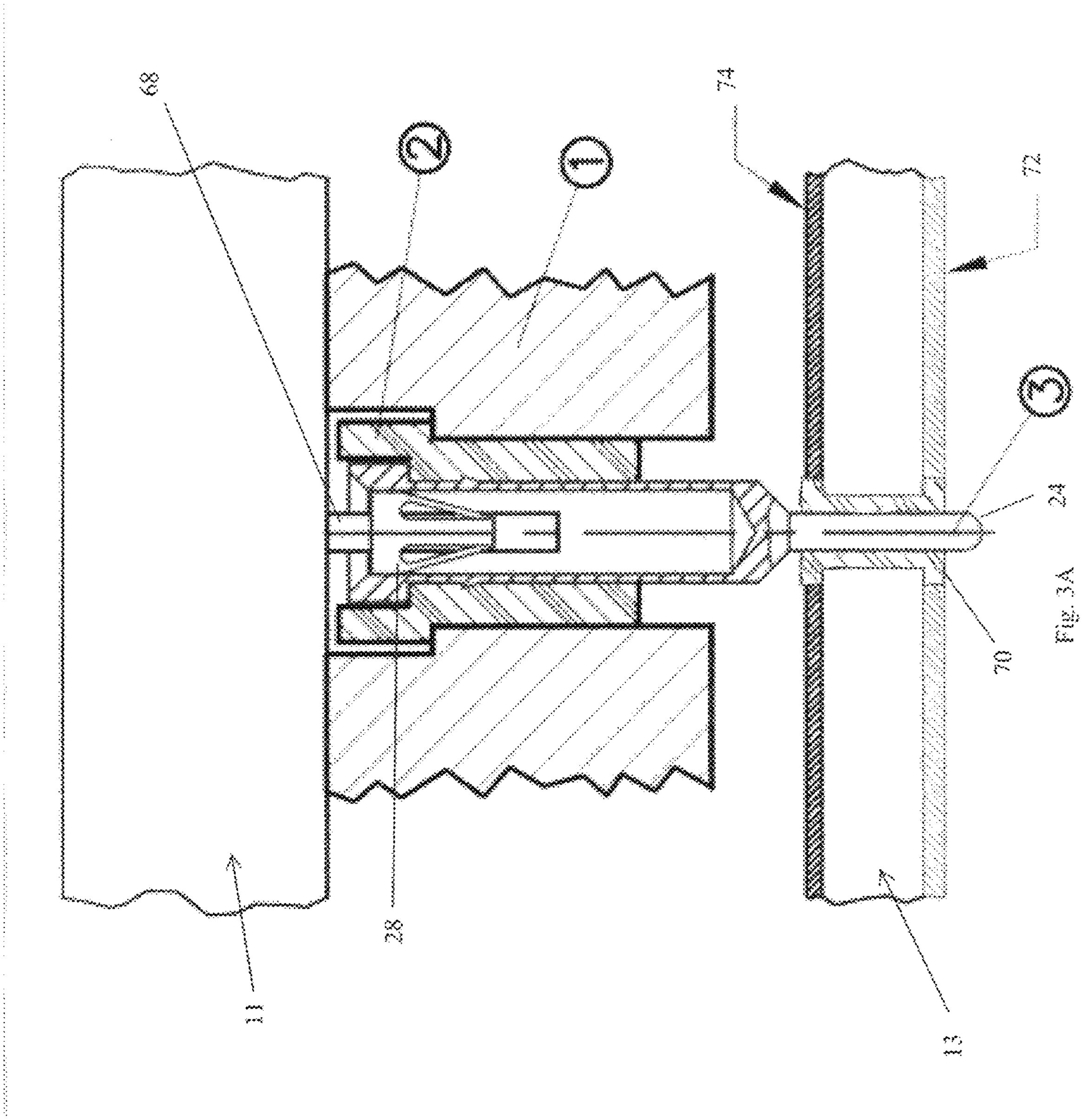
FIG. 3A is a cross sectional view of a heat socket with an electrical component and a circuit board in a first configuration.
Figure 3B:
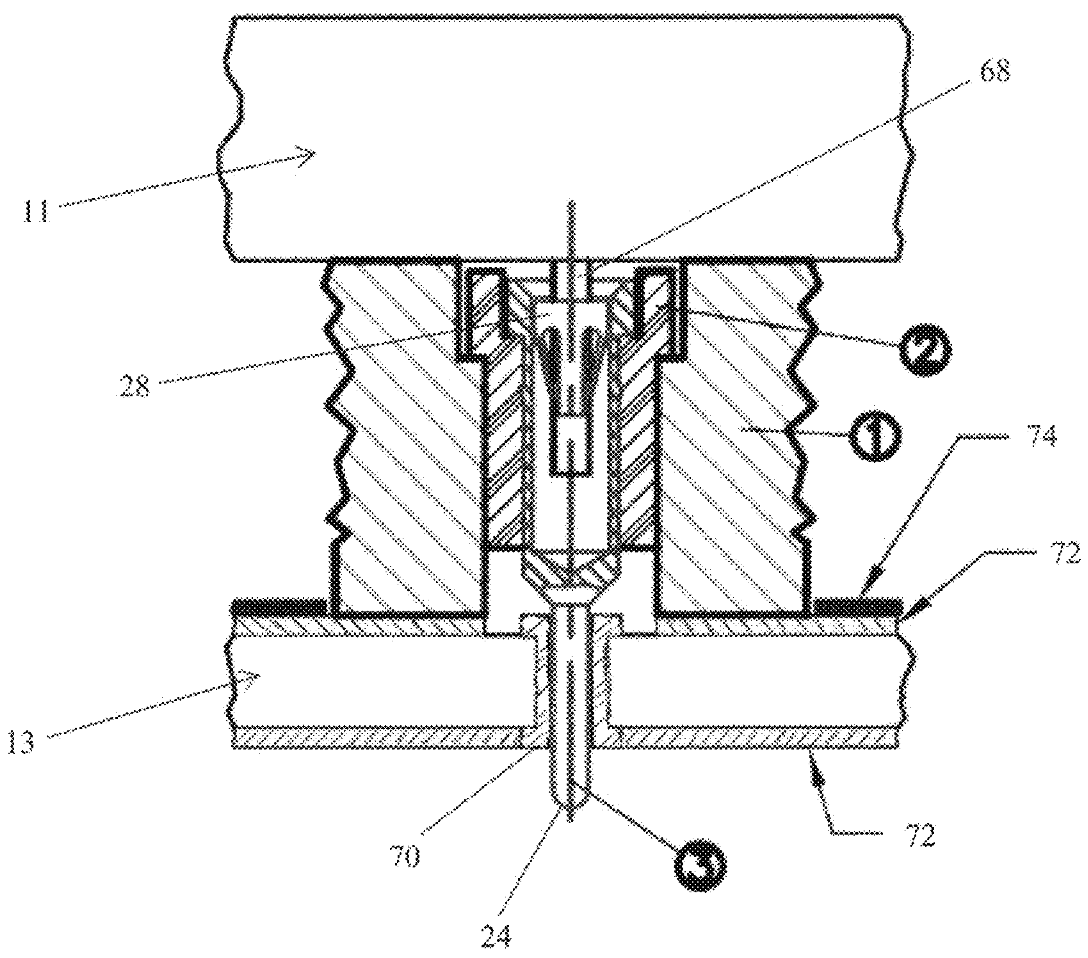
FIG. 3B is another view thereof in a second configuration.
Figure 3C:
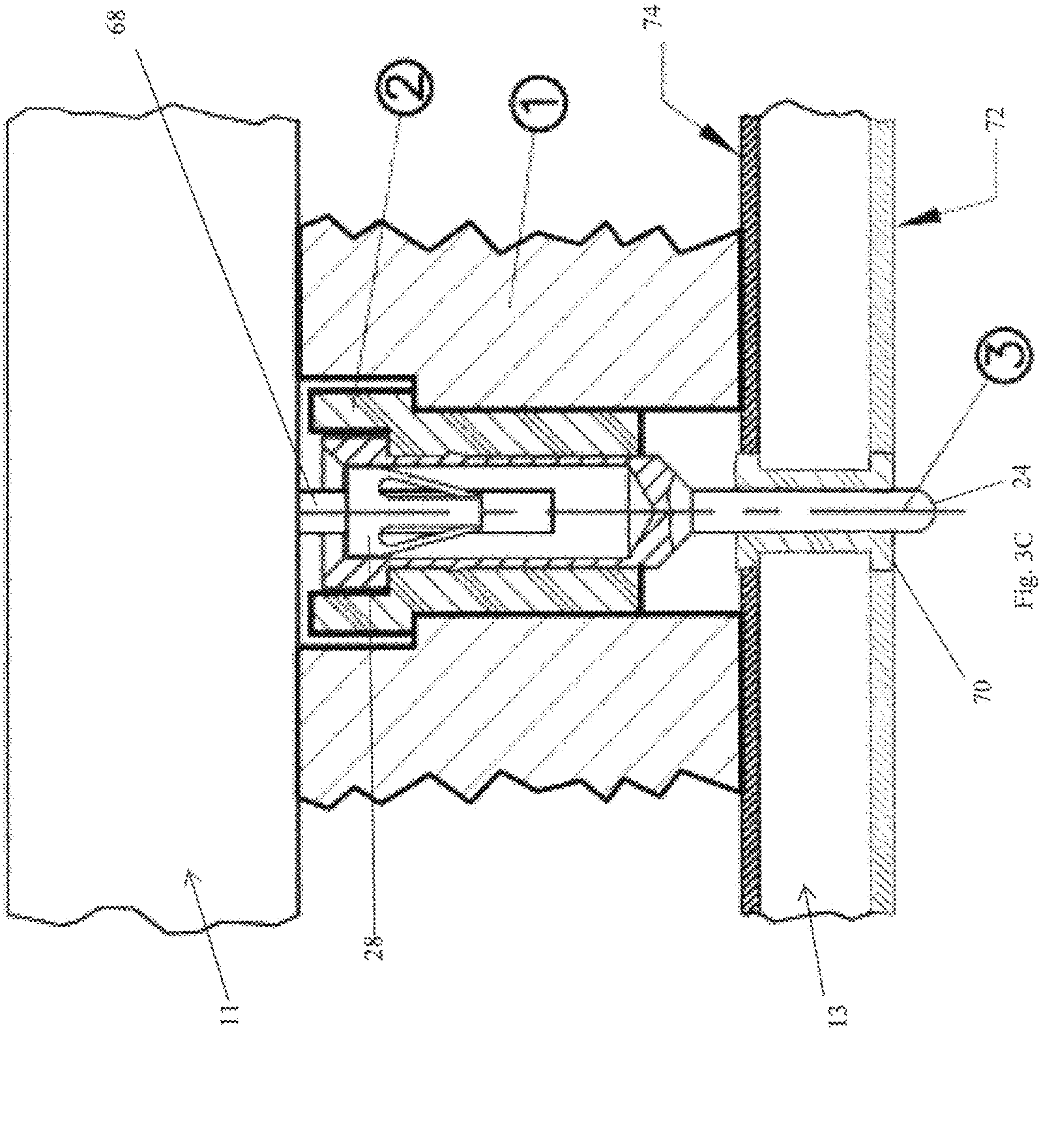
FIG. 3C is another view thereof in a third configuration.

In one configuration, shown in FIG. 3A, the heat sink socket may be separated from the circuit board by a gap. In this configuration, there is convective heat transfer around the lower surface of the heat conducting body. In another configuration, shown in FIG. 3B, the heat sink socket may be in direct contact with a conductive material 72, such as copper, on the circuit board. In this configuration, there is conductive heat transfer between the heat conducting body and the copper on the circuit board.

Where the lower surface of the heat sink socket is in direct contact with the circuit board, and heat conduction to the circuit board is undesirable, the heat sink socket may contact solder resist 74 on the circuit board, as shown in FIG. 3C.

Figure 3D:
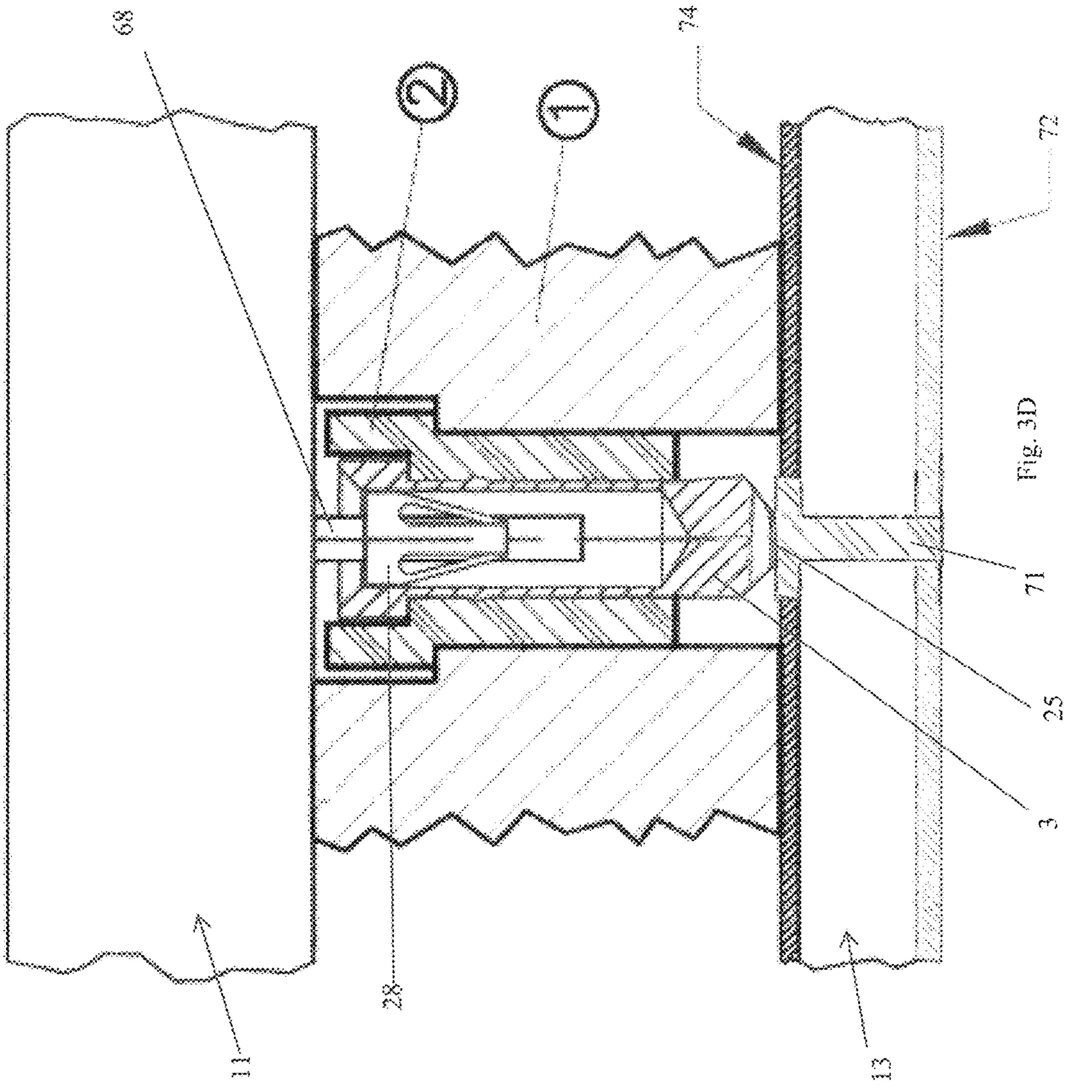
FIG. 3D is another view thereof in a fourth configuration, in which the terminal is configured as a surface mount.

In FIG. 3D, the electrical terminal is configured with a surface mount. Here, the lower surface 25 of the electrical terminal is substantially horizontal and is configured to be in direct contact on the upper surface of the socket 70 of the circuit board 13. The lower surface 25 of the electrical terminal may be soldered to the upper surface of the socket 70 or the upper surface of another electrical contact 71.

Although FIGS. 3A-3D only show an insulated terminal, alternate configurations could include a ground plane with a second electrical terminal.

Figure 4:
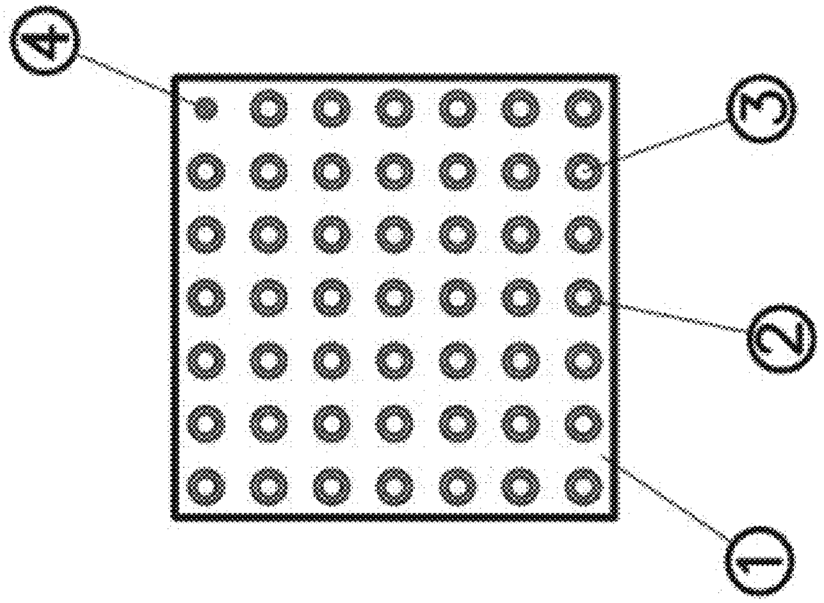
FIG. 4 is a top view of one embodiment of a heat sink socket having multiple electrical terminals, which may or may not contain a ground terminal.
Figure 5:
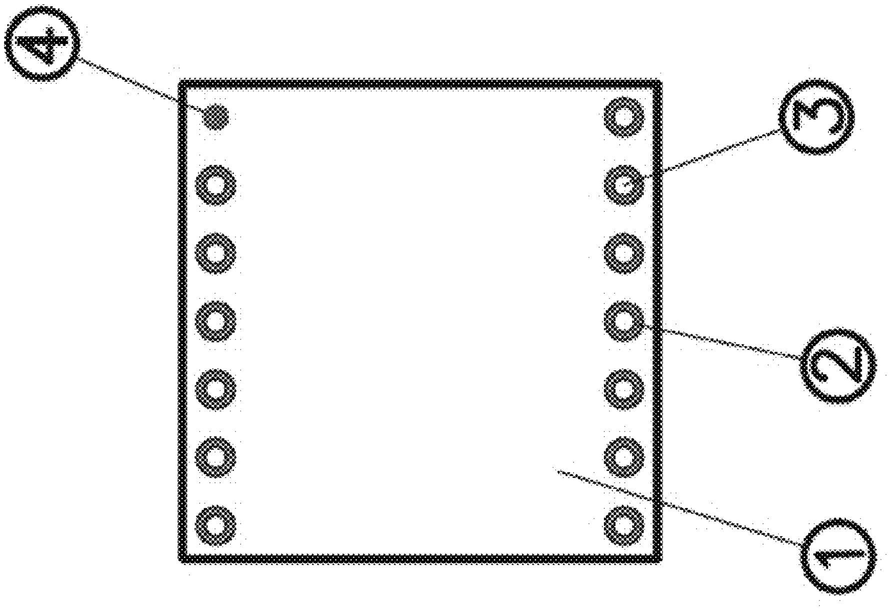
FIG. 5 is a top view of another embodiment thereof, which may or may not contain a ground terminal.
Figure 6:
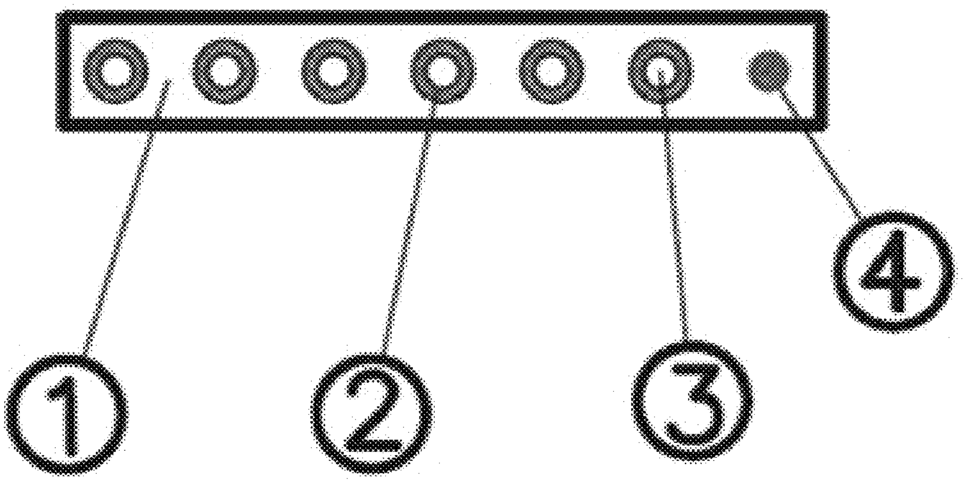
FIG. 6 is a top view of another embodiment thereof, which may or may not contain a ground terminal.

To support multiple electrical components, the heat sink socket may include more than one first electrical terminal. The electrical terminals may be arranged in the form of an array, for convenient attachment to electrical components. The array may be rectangular, square, linear, circular, or another geometric shape. FIGS. 4-6 show various arrangements of electrical terminals on a heat sink socket. Other arrangements are possible without departing from the scope of the present invention.

Figure 7:
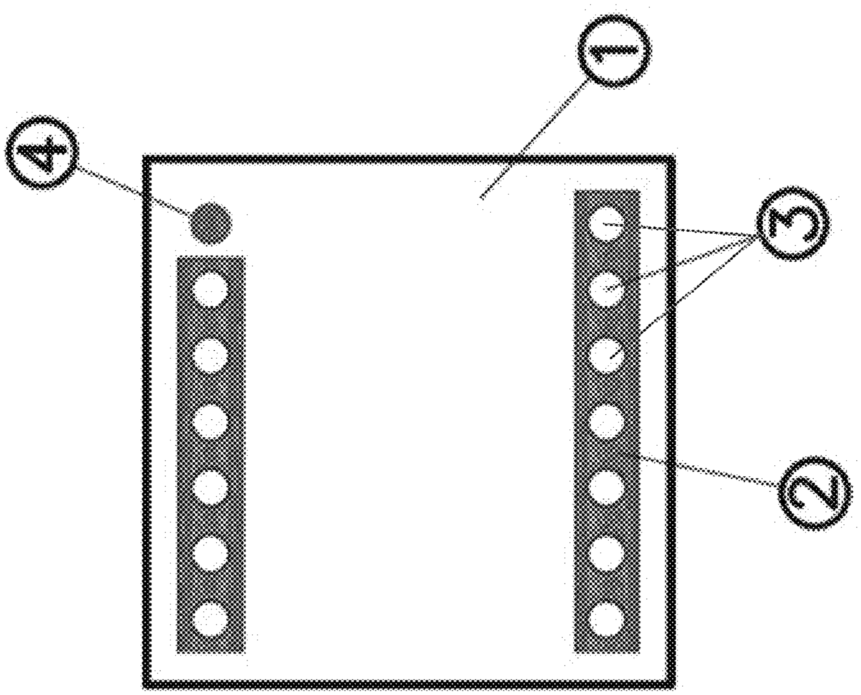
FIG. 7 is a top view of a heat sink socket having multiple terminals in an electrical insulating body, which may or may not contain a ground terminal.
Figure 8:
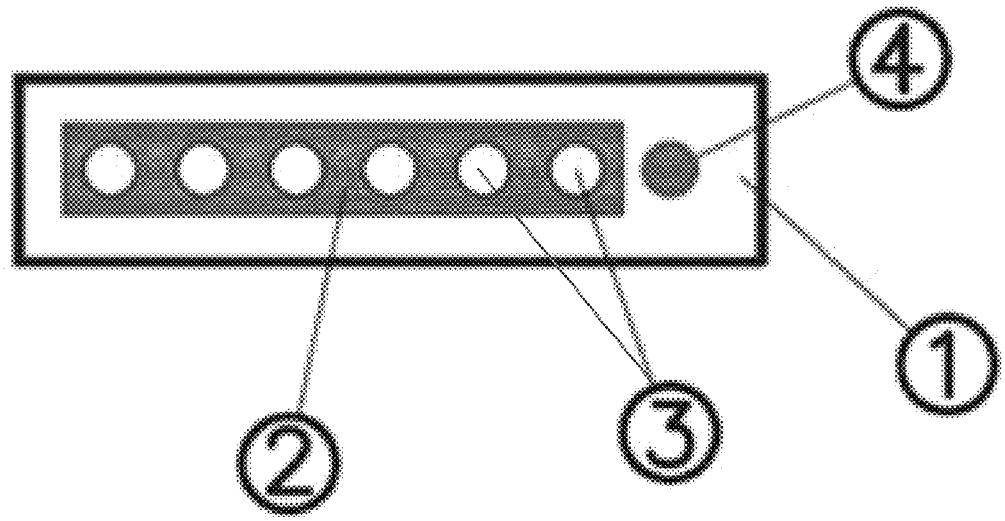
FIG. 8 is a top view of a heat sink socket having a single row of terminals, which may or may not contain a ground terminal.

For ease of manufacture, the heat conducting body may be configured to include an electrical insulating body 2 having multiple first apertures for supporting multiple first electrical terminals. FIGS. 7 and 8 show two possible embodiments of a heat sink socket with multiple first apertures in an electrical insulating body.

Figure 9:
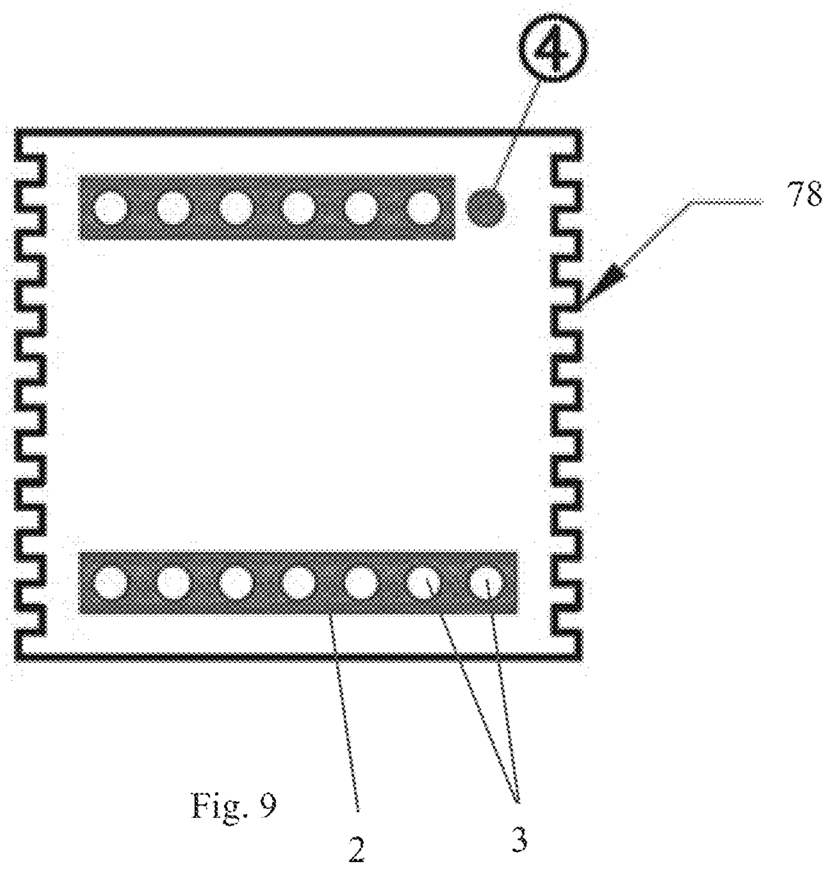
FIG. 9 is a top view of a heat sink socket having multiple terminals in an electrical insulating body, and fins along a peripheral edge of the heat sink socket, which may or may not contain a ground terminal.
Figure 10:
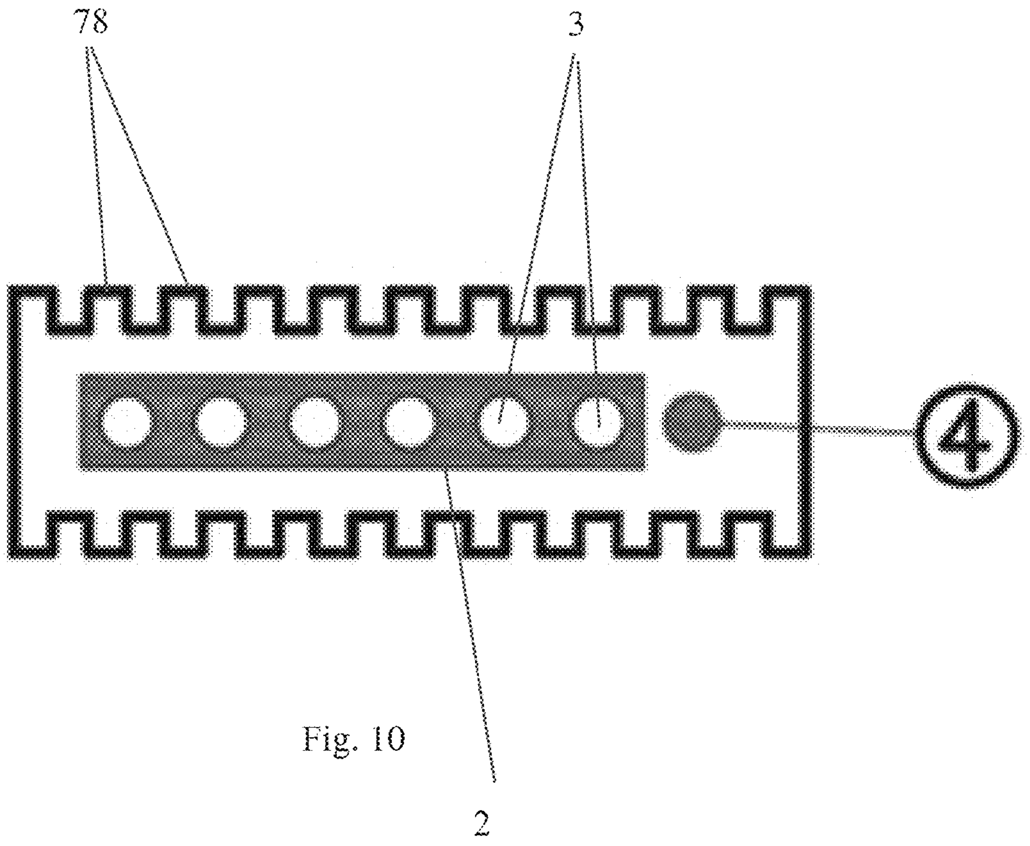
FIG. 10 is a top view of a heat sink socket having a single row of terminals and fins along a peripheral edge, which may or may not contain a ground terminal.

To provide additional cooling to the heat sink socket, the heat conducting body may have one or more fins formed on an outer peripheral edge of the heat conducting body, as shown in FIGS. 9 and 10. These fins draw heat away from the center of the heat conducting body. Fins may be formed around the entire peripheral edge, or on multiple portions of the edge, or on a single portion of the edge.

Figure 11:
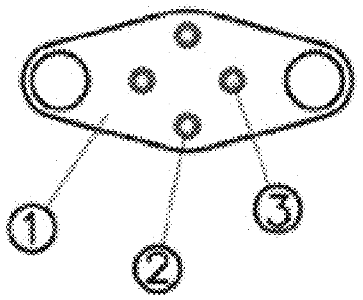
FIG. 11 is a top view of another embodiment of the heat sink socket of the present invention.
Figure 12:
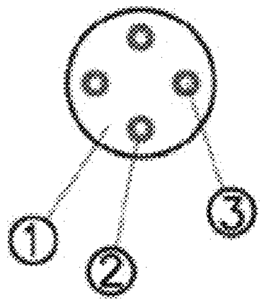
FIG. 12 is another embodiment thereof.
Figure 13:
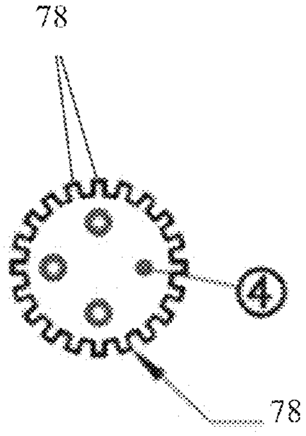
FIG. 13 is another embodiment thereof.

The arrangement of the features of the heat sink socket of the present invention can be easily adjusted to accommodate electrical components having different footprints and different electrical connector arrangements. FIGS. 11-13 show additional embodiments of the present invention.

The electrical terminals described above may be made of any conductive material, such as copper or aluminum. The electrical insulating body may be made of an insulating material such as plastic or ceramic. The heat conducting body 12 may be made of a molded conductive plastic or a conductive metal, or another heat conducting material.

Although the electrical terminals, insulating bodies, and heat conducting body are generally frictionally secured to one another when the heat sink socket is fully assembled, other methods of securing the elements may be used without departing from the scope of the present invention.

It can therefore be seen the heat sink socket of the present invention cools electronic devices that cannot be cooled with conventional heat sinks mounted on top of the electronic devices. The heat sink socket also provides a ground plane to serve as an electrical ground for the components supported on the heat sink socket. For these reasons, the instant invention is believed to represent a significant advancement in the art which has substantial commercial merit.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. A heat sink socket comprising:

a heat conducting body having an upper surface and a lower surface, the upper surface being configured to receive an electrical component, and the lower surface being configured to engage a supporting circuit board;

an insulated terminal comprising:

an electrical insulating body inserted into a first aperture in the heat conducting body, the first aperture extending through the heat conducting body from the upper surface to the lower surface, the first aperture having an inner aperture wall, the electrical insulating body having an outer wall that frictionally engages the inner aperture wall to secure the electrical insulating body within the first aperture, the electrical insulating body having an insulating aperture having an inner insulating aperture wall; and a first electrical terminal inserted into the insulating aperture of the electrical insulating body, the first electrical terminal having an outer wall that engages the inner insulating aperture wall to frictionally secure the first electrical terminal within the insulating aperture, the electrical terminal having an upper terminal end and a lower terminal end, a socket located at the upper terminal end which does not extend above the upper surface of the heat conducting body, the socket being configured to receive a contact of an electrical component, and an electrical connector located at the lower terminal end which extends beyond the lower surface of the heat conducting body for electrical engagement with said circuit board.

2. The heat sink socket of claim 1, further comprising a ground plane defined on the heat conducting body, said ground plane comprising:

a second electrical terminal inserted into a second aperture in the heat conducting body, the second aperture extending through the heat conducting body from the upper surface to the lower surface, the second aperture having an inner aperture wall, the second electrical terminal having an outer wall that frictionally and electrically engages the inner wall of the second aperture to secure the second electrical terminal within the second aperture, the second electrical terminal having an upper terminal end and a lower terminal end, a socket located at the upper terminal end which does not extend above the upper surface of the heat conducting body, the socket being configured to receive a ground contact of an electrical component, and an electrical connector located at the lower terminal end which extends beyond the lower surface of the heat conducting body for electrical engagement with the circuit board.

3. The heat sink socket of claim 1, wherein the heat conducting body has at least one heat dissipating fin formed on a peripheral edge of the heat conducting body.

4. The heat sink socket of claim 1, further comprising a plurality of insulated terminals.

5. The heat sink socket of claim 2, further comprising a plurality of insulated terminals.

6. The heat sink socket of claim 5, wherein the plurality of insulated terminals and the second terminal of the ground plane are in the form of an array.

7. The heat sink socket of claim 6, wherein the array is in the form of one of a rectangle, a square, and a line.

8. The heat sink socket of claim 1, wherein the circuit board has an upper surface that is coated with at least one of: copper and solder resist.

9. The heat sink socket of claim 1, wherein the lower surface of the heat conducting body engages the circuit board.

10. The heat sink socket of claim 1, wherein:

the first aperture of the insulated terminal has a countersunk surface adjacent the upper surface of the heat conducting body;

the electrical insulating body has a stepped shoulder seated on the countersunk surface of the first aperture;

the insulating aperture of the insulated terminal has an insulating countersunk surface; and the first electrical terminal has a stepped shoulder seated on the insulating countersunk surface.

11. The heat sink socket of claim 2, wherein:

the second aperture has a countersunk surface adjacent the upper surface of the heat conducting body; and the second electrical terminal has a stepped shoulder seated on the countersunk surface of the second aperture.

12. A heat sink socket comprising:

a heat conducting body having an upper surface and a lower surface, the upper surface being configured to receive an electrical component, and the lower surface being configured to engage one of: a supporting circuit board and a supporting surface;

an insulated terminal comprising:

an electrical insulating body inserted into a first aperture in the heat conducting body, the first aperture extending through the heat conducting body from the upper surface to the lower surface, the first aperture having an inner aperture wall and a countersunk surface adjacent the upper surface of the heat conducting body, the electrical insulating body having an outer wall that frictionally engages the inner aperture wall to secure the electrical insulating body within the first aperture, the electrical insulating body having a stepped shoulder seated on the countersunk surface of the first aperture, the electrical insulating body having a plurality of insulating apertures, each insulating aperture having an inner insulating aperture wall and an insulating countersunk surface; and a plurality of first electrical terminals, each of the first electrical terminals inserted into one of the plurality of insulating apertures of the electrical insulating body, each first electrical terminal having an outer wall that engages the respective inner insulating aperture wall to frictionally secure each first electrical terminal within the respective insulating aperture, each first electrical terminal having a stepped shoulder seated on the respective insulating countersunk surface, each electrical terminal having an upper terminal end and a lower terminal end, a socket located at the upper terminal end which does not extend above the upper surface of the heat conducting body, the socket being configured to receive a contact of an electrical component, and an electrical connector located at the lower terminal end which extends beyond the lower surface of the heat conducting body for electrical engagement with said circuit board.

13. The heat sink socket of claim 12, further comprising a ground plane defined on the heat conducting body, said ground plane comprising:

a second electrical terminal inserted into a second aperture in the heat conducting body, the second aperture extending through the heat conducting body from the upper surface to the lower surface, the second aperture having an inner aperture wall and a countersunk surface adjacent the upper surface of the heat conducting body, the second electrical terminal having an outer wall that frictionally and electrically engages the inner wall of the second aperture to secure the second electrical terminal within the second aperture, the second electrical terminal having a stepped shoulder seated on the countersunk surface of the second aperture, the second electrical terminal having an upper terminal end and a lower terminal end, a socket located at the upper terminal end which does not extend above the upper surface of the heat conducting body, the socket being configured to receive a ground contact of an electrical component, and an electrical connector located at the lower terminal end which extends beyond the lower surface of the heat conducting body for electrical engagement with the circuit board.

14. The heat sink socket of claim 12, wherein the heat conducting body has at least one heat dissipating fin formed on a peripheral edge of the heat conducting body.

15. The heat sink socket of claim 13, wherein the plurality of first electrical terminals on the electrical insulating body and the second electrical terminal are in the form of an array.

16. The heat sink socket of claim 15, wherein the array is in the shape of one of a rectangle, a square, a line, and a circle.

17. The heat sink socket of claim 12, wherein the circuit board has an upper surface that is coated with at least one of: copper and solder resist.

18. The heat sink socket of claim 12, wherein the lower surface of the heat conducting body engages the circuit board copper layer.

19. The heat sink socket of claim 12, wherein:

the first aperture has a countersunk surface adjacent the upper surface of the heat conducting body;

the electrical insulating body has a stepped shoulder seated on the countersunk surface of the first aperture;

each insulating aperture has an insulating countersunk surface; and each first electrical terminal has a stepped shoulder seated on the respective insulating countersunk surface.

20. The heat sink socket of claim 13, wherein:

the second aperture has a countersunk surface adjacent the upper surface of the heat conducting body; and the second electrical terminal has a stepped shoulder seated on the countersunk surface of the second aperture.

* * * * *